(12) United States Patent
Oh et al.

(10) Patent No.: US 9,483,231 B2
(45) Date of Patent: Nov. 1, 2016

(54) SIGNAL PROCESSING DEVICE AND METHOD

(71) Applicant: KOREA AEROSPACE RESEARCH INSTITUTE, Daejeon (KR)

(72) Inventors: Shi-Hwan Oh, Daejeon (KR); Jin-Hee Kim, Daejeon (KR)

(73) Assignee: KOREA AEROSPACE RESEARCH INSTITUTE, Daejeon (KR)

( * ) Notice: Subject to any disclaimer, the term of this patent is extended or adjusted under 35 U.S.C. 154(b) by 332 days.

(21) Appl. No.: 14/370,052

(22) PCT Filed: Dec. 18, 2012

(86) PCT No.: PCT/KR2012/011047
§ 371 (c)(1),
(2) Date: Jun. 30, 2014

(87) PCT Pub. No.: WO2013/100468
PCT Pub. Date: Jul. 4, 2013

(65) Prior Publication Data
US 2015/0012577 A1 Jan. 8, 2015

(30) Foreign Application Priority Data

Dec. 30, 2011 (KR) .......... 10-2011-0147695
Oct. 23, 2012 (KR) .......... 10-2012-0117949

(51) Int. Cl.
*G06F 7/00* (2006.01)
*G06F 7/483* (2006.01)
*H03K 21/38* (2006.01)
*H03K 21/40* (2006.01)

(52) U.S. Cl.
CPC ............. *G06F 7/483* (2013.01); *H03K 21/38* (2013.01); *H03K 21/40* (2013.01)

(58) Field of Classification Search
CPC ....... G06F 7/483; H03K 21/38; H03K 21/40
USPC ..................................... 708/201
See application file for complete search history.

(56) References Cited

U.S. PATENT DOCUMENTS 3,798,524 A * 3/1974 Okamoto ............... G05B 19/33
                                                  318/571
5,027,118 A     6/1991 Nicolai
2011/0187283 A1 * 8/2011 Wang ................... H05B 37/02
                                                  315/291

FOREIGN PATENT DOCUMENTS

| JP | H05-242316 A   | 9/1993  |
| JP | H07-154258 A   | 6/1995  |
| JP | 2009-246590 A  | 10/2009 |
| KR | 2009-0068172 A | 6/2009  |

* cited by examiner

*Primary Examiner* — Tan V. Mai
(74) *Attorney, Agent, or Firm* — Rabin & Berdo, P.C.

(57) ABSTRACT

The present invention relates to a signal processing device and method. The device receives, from a sensor which measures a physical quantity applied thereto and outputs an accumulated or integrated value of the physical quantity as an M-bit digital value, the digital value, and, when a difference between the physical quantities at two successive data acquisition times lies within a predetermined range and an absolute value of a digital counter increment is greater than $2^{M-1}$, calculate the digital counter increment as the physical quantity measured by the sensor.

10 Claims, 3 Drawing Sheets at $t=t_{i-1}$    at $t=t_i=t_{i-1}+\triangle t$ at $t=t_{i-1}$    at $t=t_i=t_{i-1}+\triangle t$ at t=t_{i-1}     at t=t_i=t_{i-1}+△t $\alpha \cdot 2^{M-1} < |\Delta C'_i| < 2^{M-1}$

SIGNAL PROCESSING DEVICE AND METHOD

TECHNICAL FIELD

The present invention relates to a signal processing device and method, and more particularly, to a signal processing device and method, which processes a digital signal from a sensor which accumulates and outputs a physical quantity.

BACKGROUND ART

A sensor which provides an accumulated or integrated value of a physical input typically outputs a digital value which is expressed as a binary counter. This digital value changes when the physical quantity changes and roll-over occurs when the physical quantity exceeds a maximum or minimum value of the digital value. In order to calculate a physical value from the accumulative digital output provided by such a sensor, a counter increment, which is a difference between a current digital output value and a previous digital output value, and a data acquisition period (or a sampling frequency, which is a reciprocal of the data acquisition period), which is a time interval between the two values, are used. In this case, when an absolute value of the counter increment is greater than a half of the maximum value that the binary counter can have, a sign of the calculated physical value is changed and thus a measurement value cannot be exactly calculated. Therefore, the absolute value of the counter increment which is the difference between the current output value and the previous output value should always be smaller than the half of the maximum value of the binary counter. That is, even when the sensor itself is able to measure a greater value, a physical quantity corresponding to the half of the counter maximum value is the maximum measurement value that can be calculated using this sensor due to the limited size of the binary counter (or the limited number of binary bits). In order to increase the maximum measurement value, the maximum value (the number of binary bits) of the counter should be increased or the sampling frequency should be increased. However, this may increase the cost of the sensor and complexity of a system using the sensor. Korean Patent Publication No. 10-2009-0068172 discloses a signal processing device for converting an output from a sensor into a digital value.

DISCLOSURE

Technical Problem

An aspect of the present invention is to solve at least the above-mentioned problems and/or disadvantages and to provide at least the advantages described below. Accordingly, an aspect of the present invention is to provide a signal processing device and method, which can increase a maximum measurement value of a sensor without increasing a maximum value of a binary counter or without increasing a sampling frequency.

Technical Solution

According to an aspect of an exemplary embodiment, there is provided a signal processing device which receives, from a sensor which measures a physical quantity and outputs an accumulated or integrated value of the physical quantity as an M-bit digital value, the digital value and processes the digital value, the signal processing device including: a signal processor configured to, when a difference between the physical quantities at two successive data acquisition times lies within a predetermined range and an absolute value of a digital counter increment is greater than $2^{M-1}$, calculate the digital counter increment as the physical quantity measured by the sensor.

An absolute value of the difference between the physical quantities may be smaller than $\alpha \times S \times 2^{M-1}/\Delta t$, and S may be a scale factor of the sensor, $\Delta t$ may be a data acquisition period of the sensor, and a may have a value smaller than 1.

The signal processor may first correct the digital counter increment by subtracting $2^M$ from the digital counter increment when the digital counter increment $\Delta C_i$ is greater than $2^{M-1}$, and adding $2^M$ to the digital counter increment when the digital counter increment is smaller than $-2^{M-1}$, and, when a digital counter output value at a time $t_{i-1}$ is $C_{i-1}$ and a digital counter output value at a time $t_i = t_{i-1} + \Delta t$ is $C_i$, the $\Delta C_i$ may be calculated as $\Delta C_i = C_i - C_{i-1}$.

When $\Delta C_i \times \Delta C_{i-1} < 0$, the signal processor may second correct the first corrected digital counter increment by subtracting $2^M$ from the first corrected digital counter increment when $\alpha \times 2^{M-1} < \Delta C_i' < 2^{M-1}$, and adding $2^M$ to the first corrected digital counter increment when $-2^{M-1} < \Delta C_i' < -\alpha \times 2^{M-1}$, and the $\Delta C_i'$ may be the first corrected digital counter increment at the time and the $\Delta C_{i-1}''$ may be the second corrected digital counter increment at the time $t_{i-1}$.

A maximum absolute value of the physical quantity that the signal processor calculates may be $(2-\alpha) \times S \times 2^{M-1}/\Delta t$.

According to an aspect of another exemplary embodiment, there is provided a signal processing method which receives, from a sensor which measures a physical quantity and outputs an accumulated or integrated value of the physical quantity as an M-bit digital value, the digital value and processes the digital value, the signal processing method including: when a difference between the physical quantities at two successive data acquisition times lies within a predetermined range and an absolute value of a digital counter increment is greater than $2^{M-1}$, calculating the digital counter increment as the physical quantity measured by the sensor.

The calculating may include first correcting the digital counter increment by subtracting $2^M$ from the digital counter increment when the digital counter increment $\Delta C_i$ is greater than $2^{M-1}$, and adding $2^M$ to the digital counter increment when the digital counter increment is smaller than $-2^{M-1}$, and, when a digital counter output value at a time $t_{i-1}$ is $C_{i-1}$ and a digital counter output value at a time $t_i = t_{i-1} + \Delta t$ is $C_i$, the $\Delta C_i$ may be calculated as $\Delta C_i = C_i - C_{i-1}$.

The calculating may include, when $\Delta C_i' \times \Delta_{i-1}'' < 0$, second correcting the first corrected digital counter increment by subtracting $2^M$ from the first corrected digital counter increment when $\alpha \times 2^{M-1} < \Delta C_i' < 2^{M-1}$, and adding $2^M$ to the first corrected digital counter increment when $-2^{M-1} < \Delta C_i' < -\alpha \times 2^{M-1}$, and the $\Delta C_i'$ may be the first corrected digital counter increment at the time $t_i$, and the $\Delta C_{i-1}''$ may be the second corrected digital counter increment at the time $t_{i-1}$.

Advantageous Effects

According to the present invention, it is possible to increase a maximum measurement value of the sensor without increasing a maximum value of a binary counter or increasing a sampling frequency, and accordingly, a system using the sensor can be designed more efficiently and economically.

BEST MODE

Figure 1:
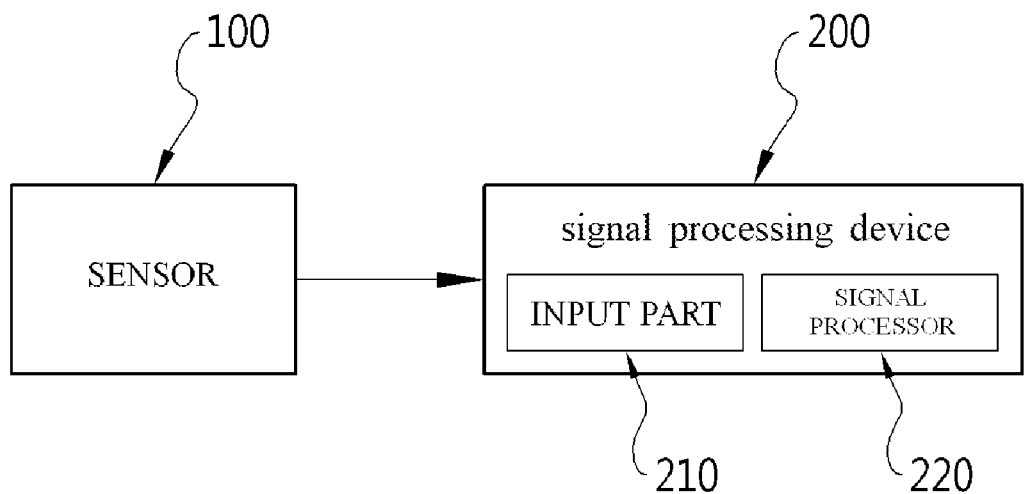
FIG. 1 is a block diagram illustrating a signal processing device according to an exemplary embodiment of the present invention.

In the following descriptions, the accompanying drawings, which constitute a part of the present invention, will be referred to. Like reference numerals refer to the like elements throughout the drawings unless otherwise indicated in the context. The exemplary embodiments described in the detailed descriptions, drawings, and claims should not be construed as limited to the exemplary embodiments set forth herein. Other exemplary embodiments can be used and other modifications can be made without departing from the idea or scope suggested herein. The elements of the present invention may be arranged as, substituted with, combined with, or designed as different elements within a wide range of different elements, as explained generally and as shown in the drawings, and it will be easily understood that all of these are clearly considered and constitute a part of the present invention.

Hereinafter, a signal processing device according to exemplary embodiments of the present invention will be explained with reference to the accompanying drawings.

Figure 2:
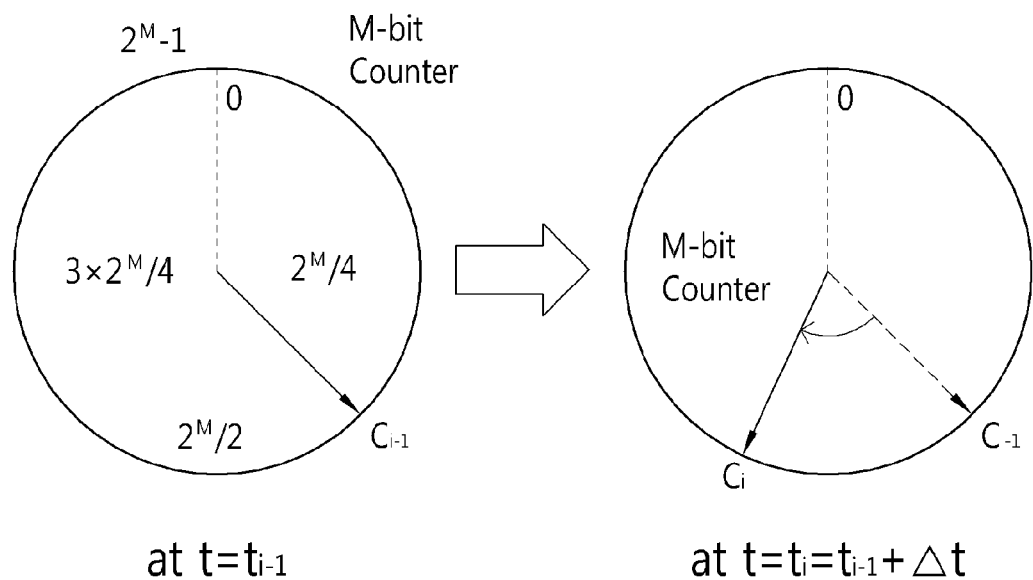
FIG. 2 is a schematic view illustrating a sensor output value which is received by a signal processing device according to an exemplary embodiment of the present invention.

FIG. 1 is a block diagram to illustrate a signal processing device according to an exemplary embodiment of the present invention, and FIG. 2 is a schematic view illustrating a sensor output value which is received by a signal processing device according to an exemplary embodiment of the present invention.

Referring to FIGS. 1 and 2, the signal processing device 200 according to an exemplary embodiment of the present invention includes an input part 210 to receive an output signal of a sensor 100 and a signal processor 220 to process the received signal.

The sensor 100 is an instrument equipped with a function of detecting and measuring various kinds of physical quantities such as an angle, acceleration, an angular speed, etc., and accumulates or integrates the physical quantity and outputs a digital value which is expressed as a binary counter. This digital value changes when the physical quantity changes and roll-over occurs when it exceeds a maximum or minimum value of the digital value.

The input part 210 receives the digital value from the sensor 100, transmits the digital value into the signal processing device 200, and performs an appropriate process with respect to the digital value so that the signal processing device 200 processes the digital value.

The signal processor 220 calculates a physical quantity to be measured by using the digital value from the sensor 100. A real physical quantity applied to the sensor at a time $t_i$ is referred to as $\omega_i$ and a measured value of the physical quantity calculated by the signal processor is referred to as $\hat{\omega}_i$ for convenience. For example, when the sensor 100 has a binary counter of M-bit, the sensor 100 outputs a digital counter value between a minimum value 0 and a maximum value $2^M-1$. As shown in FIG. 2, when a digital counter output value at a time $t_{i-1}$ is $C_{i-1}$ and a digital counter output value at a time $t_i=t_{i-1}+\Delta t$ is $C_i$, a digital counter increment during $\alpha t$ is calculated $\Delta C_i=C_i-C_{i-1}$, and the measured value of the physical quantity at $t_i$ is calculated as $\hat{\omega}_i=S\times\Delta C_i/\Delta t$. Herein, S is a scale factor of the sensor 100 and $\Delta t$ is a data acquisition period of the sensor 100.

Figure 3:
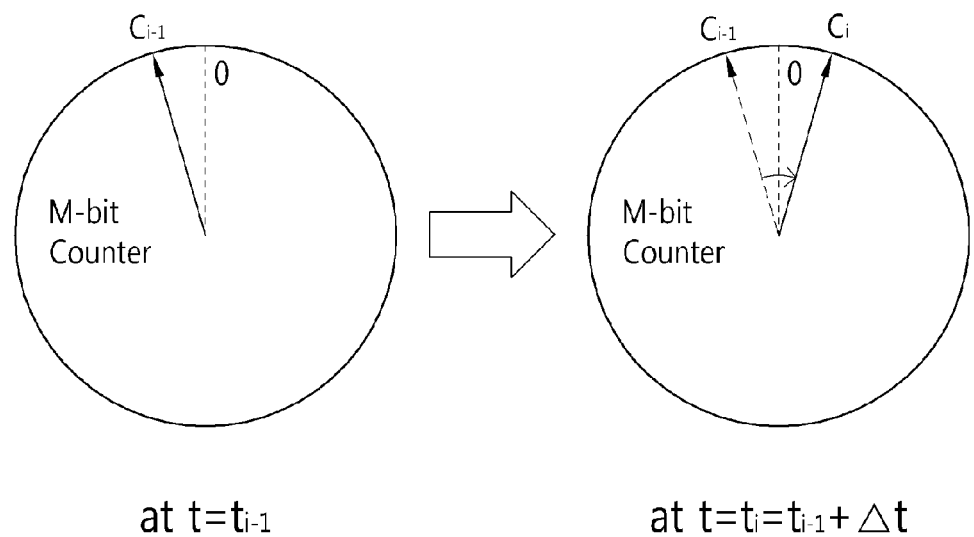
FIG. 3 is a schematic view to illustrate a correction method of a signal processing device when a sensor output rolls over in a positive direction according to an exemplary embodiment of the present invention.
Figure 4:
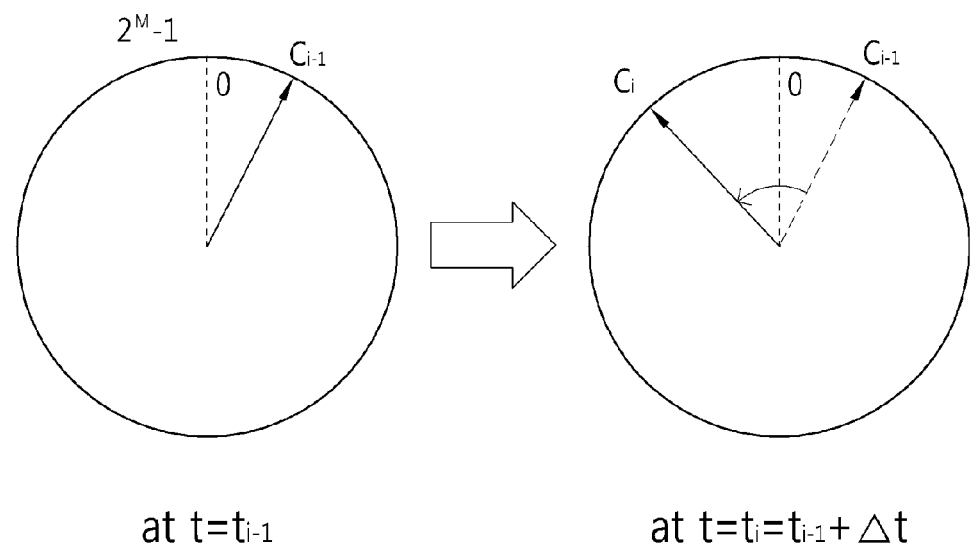
FIG. 4 is a schematic view to illustrate a correction method of a signal processing device when a sensor output rolls over in a negative direction according to an exemplary embodiment of the present invention.

FIG. 3 is a schematic view to illustrate a correction method of a signal processing device when a sensor output rolls over in a positive direction according to an exemplary embodiment of the present invention, and FIG. 4 is a schematic view to illustrate a correction method of a signal processing device when a sensor output rolls over in a negative direction according to an exemplary embodiment of the present invention.

As shown in FIG. 3, when a positive physical quantity is applied in a state in which the digital counter output value $C_{i-1}$ of the sensor 100 at the time is less than or equal to the maximum value $2^M-1$, the digital counter increases and is rotated in a clockwise direction, and when the digital counter exceeds the maximum value, the digital counter output increases from the minimum value 0 again. In this case, a phenomenon in which the digital counter output value $C_i$ at the time $t_i$ increases from the minimum value 0 again and has a certain value is referred to as positive roll-over. In this case, when the digital counter increment is calculated as $\Delta C_i=C_i-C_{i-1}$, the measured value of the physical quantity is different from the real physical quantity. When the positive roll-over occurs, the digital counter increment should be corrected to $\Delta C_i=C_i-C_{i-1}+2^M$ in order to calculate the exact physical quantity from the counter value.

In addition, as shown in FIG. 4, when a negative physical quantity is applied in a state in which the digital counter output value $C_{i-1}$ of the sensor 100 at the time is greater than or equal to the minimum value 0, the digital counter decreases and is rotated in a counter clockwise direction, and when the digital counter exceeds the minimum value, the digital counter output reaches the maximum value $2^M-1$ again and decreases from the maximum value again. In this case, a phenomenon in which the digital counter output value $C_i$ at the time $t_i$ reaches the maximum value $2^M-1$ and then decreases to have a certain value is referred to as negative roll-over. In this case, when the digital counter increment is calculated as $\Delta C_i=C_i-C_{i-1}$, the measured value of the physical quantity is different from the real physical quantity. When the negative roll-over occurs, the digital counter increment should be corrected to $\Delta C_i=C_i-C_{i-1}-2^M$ in order to calculate the exact physical quantity from the counter value.

Figure 5:
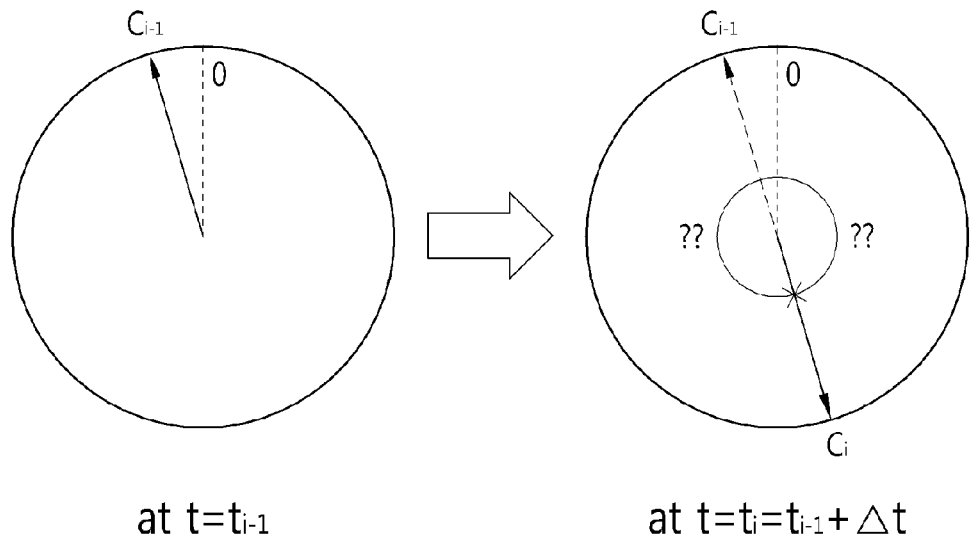
FIG. 5 is a schematic view illustrating a state in which an increasing direction is not known as an increment of a sensor output value approaches a maximum measurement value.

Referring to FIG. 5, when the applied physical quantity gradually increases and thus the digital counter increment reaches a half of $2^M$, it is difficult to determine whether the digital counter increases in the clockwise direction by the positive physical quantity or decreases in the counter clockwise direction by the negative physical quantity. When it is wrongly determined that the digital counter is rotated in the counter clockwise direction even when the positive physical quantity is really applied, the signal processor 220 calculates a measured value of a sign opposite to the sign of the applied physical quantity. This phenomenon is referred to as 'aliasing'. In order to prevent the 'aliasing', the digital counter increment $\Delta C_i$ should always be smaller than $\Delta C_{max} = 2^{M-1}$. In other words, the external physical quantity applied to the sensor should be smaller than $\omega_{max} = S \times 2^{M-1}/\Delta t$.

As a result, when a roll-over correction considering a maximum measurement area of the sensor is performed in the following method, a normal value can be calculated without 'aliasing':

(1) when $\Delta C_i < -2^{M-1}$, the digital counter increment is corrected to $\Delta C_i' = \Delta C_i + 2^M$.

(2) when $\Delta C_i > 2^{M-1}$, the digital counter increment is corrected to $\Delta C_i' = \Delta C_i - 2^M$, (3) when neither of conditions (1) and (2) is satisfied, the digital counter increment is corrected to $\Delta C_i' = \Delta C_i$.

In this method, the signal processor 220 can calculate the applied physical quantity as $\omega_i = S \times \Delta C_i'/\Delta t$. When the above-described processes (1) to (3) are referred to as a first correction of the digital counter increment, an absolute value of the physical quantity which can be calculated in this correction method is smaller than $\omega_{max}$ which is expressed by Equation 1:

$$\omega_{max} = S \times \Delta C_{max}/\Delta t = S \times 2^{M-1}/\Delta t \qquad \text{[Equation 1]}$$

On the other hand, when a change in the physical quantity to be measured by the sensor 100 (a difference between physical quantities at two successive data acquisition times) lies within a predetermined range, the maximum measurement value of the sensor 100 may be expanded to be larger than [Equation 1]. That is, it is assumed that there is $\alpha$ ($0 < \alpha < 1$) always satisfying Equation 2:

$$|\omega_i - \omega_{i-1}| < \alpha \times S \times 2^{M-1}/\Delta t = \alpha \times \omega_{max} \qquad \text{[Equation 2]}$$

Equation 2 assumes that a change in the physical quantity applied to the sensor is always smaller than α times the maximum measurement value of the sensor 100. In other words, it means that the physical quantity to be measured does not abruptly change. When the measured value of the physical quantity $\hat{\omega}_i$ is calculated only by using the first correction of the digital counter increment, there is no restriction on the change in the applied physical quantity and thus the physical quantity may change from $-\omega_{max}$ to $\omega_{max}$ and up to $2\omega_{max} = 2S \times 2^{M-1}/\Delta t$, but there is a restriction on the change in the physical quantity satisfying Equation 2.

In this case, when the sign of the digital counter increment $\Delta C_i'$ which has been first corrected at the time $t_i$ is changed to be different from the sign of the digital counter increment $\Delta C_{i-1}''$ which has been already second corrected at the time $t_{i-1}$, the maximum measurement range of the sensor can be increased by performing a second correction with respect to the digital counter increment $\Delta C_i'$ which has been first corrected at the time $t_i$ as follows. As long as $\Delta C_i' \times \Delta C_{i-1}'' < 0$ is satisfied, the signal processor 220 may correct the first corrected digital counter increment as follows:

(1) When $\alpha \times 2^{M-1} < \Delta C_i' < 2^{M-1}$, the first corrected digital counter increment is corrected to $\Delta C_i'' = \Delta_i' - 2^M$, (2) When $-2^{M-1} < \Delta C_i' < -\alpha \times 2^{M-1}$, the first corrected digital counter increment is corrected to $\Delta C_i'' = \Delta C_i' + 2^M$, (3) When neither of conditions (1) and (2) is satisfied, the first corrected digital counter increment is corrected to $\Delta C_i'' = \Delta C_i'$.

This is referred to as the second correction of the digital counter increment.

$\Delta C_i' \times \Delta C_{i-1}'' < 0$ is satisfied in two cases. The first case is a case in which the applied physical quantity gradually decreases and thus the digital counter increment is past 0 at the time $t_i$ and its sign is changed. The second case is a case in which the applied physical quantity gradually increases and thus the digital counter increment exceeds $\Delta C_{max} = 2^{M-1}$, causing aliasing. When the sign is changed as the applied physical quantity gradually decreases, the changed sign is accepted as it is and the physical quantity should be calculated by using the first corrected digital counter increment. However, when the applied physical quantity gradually increases and thus the aliasing occurs, the sign of the physical quantity should not be changed. Therefore, when the first correction value $\Delta_i'$ of the digital counter increment corresponds to the second correction conditions (1) and (2) of the digital counter increment, the second correction is performed to return the changed sign.

Figure 6:
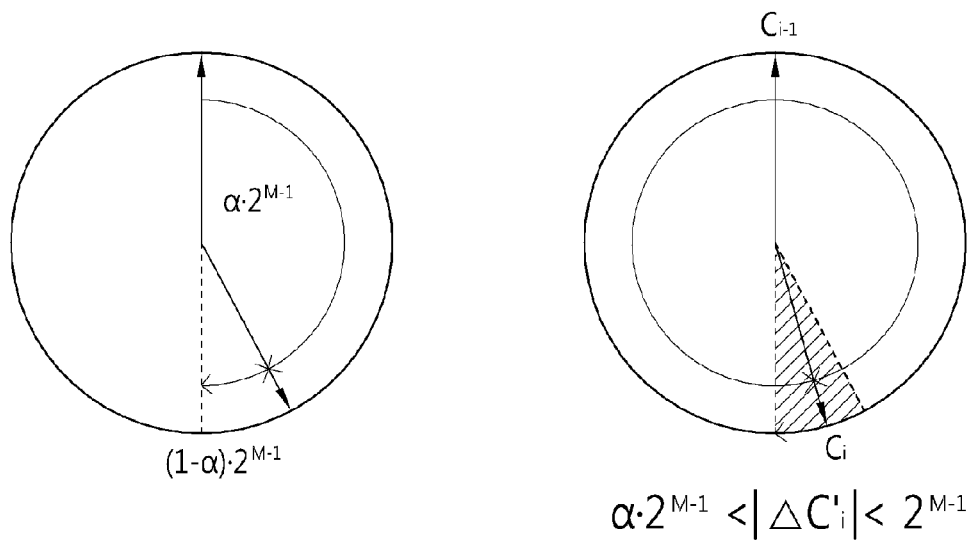
FIG. 6 is a schematic view illustrating a correction method for expanding a sensor maximum measurement value of a signal processing device according to an exemplary embodiment of the present invention.

FIG. 6 illustrates an example of this case. When $C_{i-i}$ is 0 and $C_i$ exists in the hatched area, the first correction value $\Delta C_i'$ of the digital counter increment exists within a range of $\alpha \times 2^{M-1} < \Delta C_i' < 2^{M-1}$. When the second correction value $\Delta C_{i-1}''$ at the time $t_{i-1}$ is a positive number, the second correction value $\Delta C_i''$ at the time $t_i$ becomes $\Delta C_i'$, but when the second correction value $\Delta C_{i-1}''$ at the time $t_{i-1}$ is a negative number, the second correction value $\Delta C_i''$ at the time $t_i$ is returned to $\Delta C_i' - 2^M$, a negative value. This is because that when the physical quantity applied to the sensor satisfies Equation 2 and the physical quantity at the time is a negative value ($\Delta C_{i-1}''$ is a negative value), the physical quantity at the time $t_i$ cannot be abruptly changed to a positive value and also cannot enter the hatched area. Therefore, even when the physical quantity at the time $t_i$ exceeds $\omega_{max}$ of Equation 1, it can be determined whether the positive physical quantity is applied or the negative physical quantity is applied and thus it is possible to exactly calculate the applied physical quantity without causing aliasing.

According to the exemplary embodiments described above, the signal processing device can expand the maximum measurement value when there is a restriction on the difference between the physical quantities at the two successive data acquisition times. The increased measurable upper bound can be expressed by Equation 3:

$$\omega_{max} = (2-\alpha) \times S \times \Delta C_{max}/\Delta t = (2-\alpha) \times \omega_{max} \qquad \text{[Equation 3]}$$

For example, when α is 0.8, the maximum measurement range may be improved by 1.2 times. α may be determined by analysis. That is, α satisfying Equation 2 can be acquired by estimating a value that a physical quantity of an object to be measured can have in various environments and calculating its change rate.

According to the exemplary embodiment described above, the signal processing device receives the output digital value from the sensor 100 and corrects it under a predetermined condition, thereby expanding the maximum measurement range that the signal processor 220 can calculate. In addition, a physical quantity exceeding a typical measurement range can be exactly calculated.

While the invention has been shown and described with reference to certain preferred embodiments thereof, it will be understood by those skilled in the art that various changes in form and details may be made therein without departing from the spirit and scope of the invention as defined by the appended claims. Therefore, the scope of the invention is defined not by the detailed description of the invention but by the appended claims, and all differences within the scope will be construed as being included in the present invention.

The invention claimed is:

1. A signal processing device which receives, from a sensor which measures a physical quantity and outputs an accumulated or integrated value of the physical quantity as an M-bit digital value, the digital value and processes the digital value, the signal processing device comprising:
a signal processor configured to, when a difference between the physical quantities at two successive data acquisition times lies within a predetermined range and an absolute value of a digital counter increment is greater than $2^{M-1}$, calculate the digital counter increment as the physical quantity measured by the sensor.

2. The signal processing device of claim 1, wherein an absolute value of the difference between the physical quantities is smaller than $\alpha \times S \times 2^{M-1}/\Delta t$, and
wherein S is a scale factor of the sensor, $\Delta t$ is a data acquisition period of the sensor, and $\alpha$ has a value smaller than 1.

3. The signal processing device of claim 2, wherein the signal processor first corrects the digital counter increment by subtracting $2^M$ from the digital counter increment when the digital counter increment $\Delta C_i$ is greater than $2^{M-1}$, and adding $2^M$ to the digital counter increment when the digital counter increment is smaller than $-2^{M-1}$, and
wherein, when a digital counter output value at a time $t_{i-1}$ is $C_{i-1}$ and a digital counter output value at a time $t_i = t_{i-1} + \Delta t$ is $C_i$, the $\Delta C_i$ is calculated as $\Delta C_i = C_i - C_{i-1}$.

4. The signal processing device of claim 3, wherein, when $\Delta C_i' \times \Delta C_{i-1}'' < 0$, the signal processor second corrects the first corrected digital counter increment by subtracting $2^M$ from the first corrected digital counter increment when $\alpha \times 2^{M-1} < \Delta C_i' < 2^{M-1}$, and adding $2^M$ to the first corrected digital counter increment when $-2^{M-1} < \Delta C_i' < -\alpha \times 2^{M-1}$, and
wherein the $\Delta C_i'$ is the first corrected digital counter increment at the time and the $\Delta C_{i-1}''$ is the second corrected digital counter increment at the time $t_{i-1}$.

5. The signal processing device of claim 4, wherein a maximum absolute value of the physical quantity that the signal processor calculates is $(2-\alpha) \times S \times 2^{M-1}/\Delta t$.

6. A signal processing method which receives, from a sensor which measures a physical quantity and outputs an accumulated or integrated value of the physical quantity as an M-bit digital value, the digital value and processes the digital value, the signal processing method comprising:
when a difference between the physical quantities at two successive data acquisition times lies within a predetermined range and an absolute value of a digital counter increment is greater than $2^{M-1}$, calculating the digital counter increment as the physical quantity measured by the sensor.

7. The signal processing method of claim 6, wherein an absolute value of the difference between the physical quantities is smaller than $\alpha \times S \times 2^{M-1}/\Delta t$, and
wherein S is a scale factor of the sensor, $\Delta t$ is a data acquisition period of the sensor, and $\alpha$ has a value smaller than 1.

8. The signal processing method of claim 7, wherein the calculating comprises first correcting the digital counter increment by subtracting $2^M$ from the digital counter increment when the digital counter increment $\Delta C_i$ is greater than $2^{M-1}$, and adding $2^M$ to the digital counter increment when the digital counter increment is smaller than $-2^{M-1}$, and
wherein, when a digital counter output value at a time $t_{i-1}$ is $C_{i-1}$ and a digital counter output value at a time $t_i = t_{i-1} + \Delta t$ is $C_i$, the $\Delta C_i$ is calculated as $\Delta C_i = C_i - C_{i-1}$.

9. The signal processing method of claim 8, wherein the calculating comprises, when $\Delta C_i' \times \Delta C_{i-1}'' < 0$, second correcting the first corrected digital counter increment by subtracting $2^M$ from the first corrected digital counter increment when $\Delta + 2^{M-1} < \Delta C_i' < 2^{M-1}$, and adding $2^M$ to the first corrected digital counter increment when $-2^{M-1} < \Delta C_i' < -\alpha \times 2^{M-1}$, and
wherein the $\Delta C_i'$ is the first corrected digital counter increment at the time and the $\Delta C_{i-1}''$ is the second corrected digital counter increment at the time $t_{i-1}$.

10. The signal processing method of claim 9, wherein a maximum absolute value of the physical quantity that is calculated at the calculating operation is $(2-\alpha) \times S \times 2^{M-1}/\Delta t$.

* * * * *